US012641727B2

(12) United States Patent
Chi et al.

(10) Patent No.: US 12,641,727 B2
(45) Date of Patent: May 26, 2026

(54) ELECTRONIC DEVICE

(71) Applicant: Innolux Corporation, Miaoli County (TW)

(72) Inventors: Jen-Hai Chi, Miaoli County (TW); Shun-Yuan Hu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 166 days.

(21) Appl. No.: 18/432,021

(22) Filed: Feb. 4, 2024

(65) Prior Publication Data

US 2024/0306303 A1 Sep. 12, 2024

Related U.S. Application Data

(60) Provisional application No. 63/450,664, filed on Mar. 8, 2023.

(30) Foreign Application Priority Data

Nov. 24, 2023 (CN) .......................... 202311583484.2

(51) Int. Cl.
*H05K 1/181* (2026.01)
*H01R 4/02* (2006.01)
(Continued)

(52) U.S. Cl.
CPC ............... *H05K 1/181* (2013.01); *H01R 4/02* (2013.01); *H05K 2201/10636* (2013.01);
(Continued)

(58) Field of Classification Search
CPC .............. H05K 1/18; H05K 1/181–187; H01L 24/13–17; H01L 24/81; H01L 23/498;
(Continued)

(56) References Cited

U.S. PATENT DOCUMENTS 6,125,043 A * 9/2000 Hauer ..................... H01L 24/81
174/257
6,346,679 B1 * 2/2002 Nakamura .............. H01L 24/73
361/767
(Continued)

FOREIGN PATENT DOCUMENTS

| | | |
|---|---|---|
| CN | 111316437 | 6/2020 |
| CN | 112436000 | 3/2021 |
| TW | 201225828 | 6/2012 |

*Primary Examiner* — Tuan T Dinh
(74) *Attorney, Agent, or Firm* — JCIPRNET

(57) ABSTRACT

An electronic device includes a circuit substrate, an electronic element, and a connection layer. The circuit substrate includes a plurality of first bonding pads. The electronic element includes a plurality of second bonding pads. The connection layer is provided between one of the first bonding pads and one of the second bonding pads. The connection layer includes a first portion, a second portion, and a third portion. The second portion is a portion of the connection layer that overlaps with a projection region of the second bonding pad onto the circuit substrate. The first portion is a portion away from another first bonding pad that does not overlap with the projection region. The third portion is a portion which is adjacent to the another first bonding pad and does not overlap with the projection region. A maximum width of the first portion is different from that of the third portion.

18 Claims, 8 Drawing Sheets

100a

(51) Int. Cl.

| | |
|---|---|
| *H10W 72/00* | (2026.01) |
| *H10W 72/20* | (2026.01) |
| *H10W 72/90* | (2026.01) |
| *H10W 90/00* | (2026.01) |

(52) U.S. Cl.

CPC  *H10W 72/07253* (2026.01); *H10W 72/07254* (2026.01); *H10W 72/234* (2026.01); *H10W 72/244* (2026.01); *H10W 72/926* (2026.01); *H10W 72/932* (2026.01); *H10W 72/934* (2026.01); *H10W 72/9445* (2026.01); *H10W 90/724* (2026.01)

(58) Field of Classification Search

CPC ......... H01L 23/49811; H01L 23/49816; H01L 23/49822; H01L 23/49836

USPC ......................... 361/767–774; 174/260–264; 257/733–738, 777–780

See application file for complete search history.

(56) References Cited

U.S. PATENT DOCUMENTS

| | | | | |
|---|---|---|---|---|
| 6,441,316 B1 * | 8/2002 | Kusui | ................... | H05K 3/3452 |
| | | | | 257/E23.068 |
| 6,927,491 B1 * | 8/2005 | Yamada | ................... | H01L 24/14 |
| | | | | 257/E21.511 |
| 7,573,722 B2 * | 8/2009 | Tsai | ..................... | H05K 3/3442 |
| | | | | 361/767 |
| 7,906,733 B2 * | 3/2011 | Kumakura | ............ | H01L 25/105 |
| | | | | 438/106 |
| 10,897,820 B2 * | 1/2021 | Noguchi | .............. | H05K 1/0271 |
| 2006/0267157 A1 * | 11/2006 | Edwards | .............. | H05K 3/3436 |
| | | | | 257/E23.072 |

* cited by examiner

II                                                II

120a

122a

130a

112a

110a

100a

100e

100f

ELECTRONIC DEVICE

CROSS-REFERENCE TO RELATED APPLICATION

This application claims the priority benefit of the U.S. provisional application Ser. No. 63/450,664, filed on Mar. 8, 2023, and the priority benefit of China application serial no. 202311583484.2, filed on Nov. 24, 2023. The entirety of each of the above-mentioned patent applications is hereby incorporated by reference herein and made a part of this specification.

BACKGROUND

Technical Field

The disclosure relates to an electronic device, and in particular to an electronic device having a circuit substrate and an electronic element.

Description of Related Art

In conventional technology, the bonding pad of the electronic element and the bonding pad of the circuit substrate are mostly designed in center alignment. When the size of the electronic element is reduced, the spacing between two adjacent bonding pads of the electronic element will also be reduced. At this time, if the bonding pad of the electronic element and the bonding pad of the circuit substrate are designed in center alignment, the spacing between the two adjacent bonding pads of the circuit substrate is also required to be reduced. When the electronic element is bonded to the circuit substrate, a soldering step is usually carried out. Since the spacing between two adjacent bonding pads is reduced, a risk of short-circuit easily arises at this time, and the electronic element is easily shifted after the solder reflow, which affects the structural reliability of the product.

SUMMARY

The electronic device of the disclosure includes a circuit substrate, an electronic element, and a connection layer. The circuit substrate includes a plurality of first bonding pads. The electronic element includes a plurality of second bonding pads. The connection layer is provided between one of the plurality of first bonding pads and one of the plurality of second bonding pads. The connection layer includes a first portion, a second portion, and a third portion. The second portion is connected between the first portion and the third portion. The second portion is defined as a portion of the connection layer that overlaps with a projection region of the second bonding pad onto the circuit substrate. The first portion is defined as a portion away from another first bonding pad of the plurality of first bonding pads that does not overlap with the projection region. The third portion is defined as a portion which is adjacent to the another first bonding pad of the plurality of first bonding pads and does not overlap with the projection region. A maximum width of the first portion is different from a maximum width of the third portion in a direction perpendicular to a normal direction of the circuit substrate.

In order to make the aforementioned features and advantages of the disclosure comprehensible, embodiments accompanied with drawings are described in detail below.

DESCRIPTION OF THE EMBODIMENTS

Figure 1A:
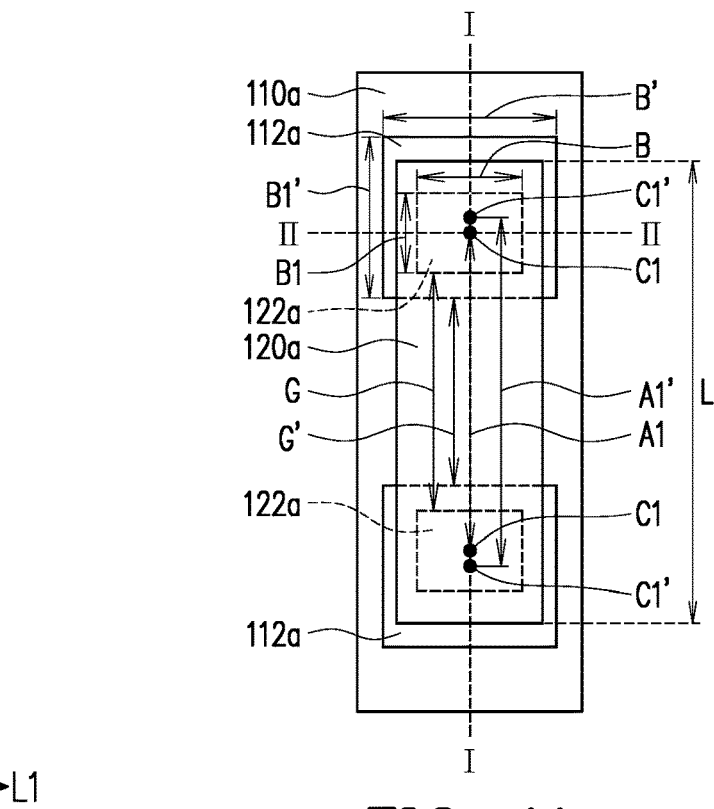
FIG. 1A is a partial top schematic view of an electronic device according to one embodiment of the disclosure.

The following description lists various embodiments of this case to introduce the basic concepts of this case, and is not intended to limit the content of this case. The actual invention range should be defined according to the claims. References of the exemplary embodiments of the disclosure are to be made in detail. Examples of the exemplary embodiments are illustrated in the drawings. If applicable, the same reference numerals in the drawings and the descriptions indicate the same or similar parts.

Certain terms may be used throughout the disclosure and the appended claims to refer to specific elements. It should be understood by those skilled in the art that sensing device manufacturers may refer to the same elements by different names. The disclosure does not intend to distinguish between components that have the same function but have different names. In the following description and claims, words such as "comprising" and "including" are open-ended words, so they should be interpreted as meaning "including but not limited to . . . ".

In the disclosure, wordings used to indicate directions, such as "up," "down," "front," "back," "left," and "right," merely refer to directions in the accompanying drawings. Therefore, the directional wordings are used to illustrate rather than limit the disclosure. In the accompanying drawings, the drawings illustrate the general features of the methods, structures, and/or materials used in the particular embodiments. However, the drawings shall not be interpreted as defining or limiting the scope or nature covered by the embodiments. For example, the relative sizes, thicknesses, and locations of the layers, regions, and/or structures may be reduced or enlarged for clarity.

A structure (or layer, element, substrate) described in this disclosure is located on/above another structure (or layer, element, substrate), may indicate that the two structures are adjacent and directly connected, or may indicate that the two structures are adjacent but not directly connected. Indirect connection means that there is at least one intermediate structure (or intermediate layer, intermediate element, intermediate substrate, intermediate spacer) between the two structures, the lower surface of one structure is adjacent to or directly connected to the upper surface of the intermediate structure, and the upper surface of another structure is adjacent to or directly connected to the lower surface of the intermediate structure. The intermediate structure can be composed of a single-layer or multi-layer physical structure or a non-physical structure, which is not limited thereto. In the disclosure, when a certain structure is provided "on" other structures, it may mean that a certain structure is "directly" on other structures, or it means that a certain structure is "indirectly" on other structures, that is, at least one structure is sandwiched between a certain structure and other structures.

The disclosure can be understood by referring to the following detailed description in conjunction with the accompanying drawings. It should be noted that, for the ease of understanding by the readers and for the brevity of the accompanying drawings, multiple drawings in the disclosure only depict a portion of the electronic device, and the specific elements in the drawings are not drawn according to the actual scale. In addition, the number and size of each of the elements in the figures are for illustration purposes only, and are not intended to limit the scope of the disclosure.

Certain terms may be used throughout the disclosure and the appended claims to refer to specific elements. It should be understood by those skilled in the art that electronic apparatus manufacturers may refer to the same elements by different names. The disclosure does not intend to distinguish between elements that have the same function but have different names.

In the following description and claims, words such as "comprising" and "including" are open-ended words, so they should be interpreted as meaning "including but not limited to . . . ".

In addition, relative terms, such as "below" or "bottom" and "above" or "top", may be used in the embodiments to describe the relative relationship of one element of the drawing to another element. It is understood that if the device in the drawing is turned upside down, elements described as being on the "lower" side would then be elements described as being on the "upper" side.

In some embodiments of the disclosure, terms related to joining and connecting, such as "connected", "interconnected", etc., unless otherwise defined, may mean that two structures are in direct contact, or may also mean that two structures are not in direct (indirect) contact, in which there are other structures located between these two structures. The terms related to joining and connecting can also include the case where both structures are movable, or both structures are fixed. In addition, the term "coupling" includes the transfer of energy between two structures through direct or indirect electrical connection, or the transfer of energy between two separate structures through mutual induction.

It should be understood that when an element or layer is referred to as being "on" or "connected to" another element or layer, it may be directly on or directly connected to this other element or layer, or there may be an intervening element or layer in between (indirect case). In contrast, when an element is referred to as being "directly on" or "directly connected to" another element or layer, there are no intervening elements or layers present.

The terms "about", "equal to", "equal" or "same", "substantially" or "generally" are interpreted as within 20% of a given value or range, or interpreted as within 10%, 5%, 3%, 2%, 1%, or 0.5% of the given value or range.

As used herein, the terms "film" and/or "layer" may refer to any continuous or discontinuous structure and material (such as a material deposited by the methods disclosed herein). For example, films and/or layers may include two-dimensional materials, three-dimensional materials, nanoparticles, or even partial or complete molecular layers, or partial or complete atomic layers, or atomic and/or molecular clusters. The film or layer may include a material or layer having pinholes, which may be at least partially continuous.

In addition, any two values or directions used for comparison may have certain errors. If a first value is equal to a second value, it implies that there may be an error of about 10% between the first value and the second value; if a first direction is perpendicular to or "substantially" perpendicular to a second direction, an angle between the first direction and the second direction may be between 80 degrees and 100 degrees; if the first direction is parallel to or "substantially" perpendicular to the second direction, an angle between the first direction and the second direction may be between 0 degrees and 10 degrees.

The terms such as "first", "second", etc. used in the description and the claims are used to modify elements, which do not imply and represent that the (or these) elements have any previous ordinal numbers, and does not represent the order of a certain element and another element, or the order of the manufacturing method. The use of these ordinal numbers is to only clearly distinguish an element with a certain name from another element with the same name. The same terms may not be used in the claims and the description, and accordingly, the first component in the description may be the second component in the claims.

Furthermore, the terms "a given range is from a first value to a second value", "a given range is within a range from the first value to the second value" means that the given range includes the first value, the second value, and other values in between.

It should be understood that, according to the embodiment of the disclosure, optical microscope (OM), scanning electron microscope (SEM), film thickness profiler (α-step), ellipsometer, or other suitable methods may be used to measure the depth, thickness, width, or height of each element, or the spacing or distance between elements. According to some embodiments, a scanning electron microscope can be used to obtain a cross-sectional structure image including an element to be measured, and to measure the depth, thickness, width, or height of each element, or the spacing or distance between elements.

Unless otherwise defined, all terms (including technical and scientific terms) used herein have the same meaning as commonly understood by one of ordinary skill in the art to which this disclosure belongs. It is understood that these terms, such as those defined in commonly used dictionaries, should be interpreted as having meanings consistent with the relevant art and the background or context of the disclosure, and should not be interpreted in an idealized or overly formal manner, unless otherwise defined herein.

It should be noted that, in the following embodiments, the technical features in several different embodiments can be replaced, reorganized, and mixed to complete other embodiments without departing from the spirit of the disclosure.

The electronic device of this disclosure may include an electronic element. The electronic element (such as the electronic element 120*a*, the electronic element 120*b*, the electronic element 120*c*, the electronic element 120*d*, and/or the electronic element 120*f* to be respectively mentioned in the subsequent embodiments) can include passive elements, active elements, or a combination of the foregoing, such as capacitors, resistors, inductors, varactor diodes, variable capacitors, filters, diodes, transistors, sensors, MEMS, liquid crystal chips, etc., but not limited thereto. The diodes may include light emitting diodes or non-light emitting diodes. The diodes include P-N. junction diodes, PIN diodes, or constant current diodes. The light emitting diode may include, for example, an organic light-emitting diode (OLED), a mini light-emitting diode (mini LED), a micro light-emitting diode (micro LED), a quantum dot light-emitting diode (quantum dot LED), fluorescence, phosphor, or other suitable materials, or a combination thereof, but not limited thereto. The sensor may, for example, include capacitive sensors, optical sensors, electromagnetic sensors, fingerprint sensors (FPS), touch sensors, antennas, or pen sensors, etc., but not limited thereto. Hereinafter, a display device is used as the electronic device to illustrate this disclosure, but this disclosure is not limited thereto. The electronic element (such as the electronic element 120*a*, the electronic element 120*b*, the electronic element 120*c*, the electronic element 120*d*, and/or the electronic element 120*f* to be respectively mentioned in the subsequent embodiments) can include a die, or an LED die, which can be a die including silicon (Si), gallium arsenide (GaAs), gallium nitride (GaN), silicon carbide (SiC), sapphire, or glass substrate, but are not limited thereto. In another embodiment, the above-mentioned die may include a semiconductor package element, such as a ball grid array (BGA) package element, a chip size package (CSP) element, a flip chip or a 2.5D/3D semiconductor package element, but not limited thereto. In another embodiment, the die may be any flip-chip bonding element, such as integrated circuits (IC), transistors, controllable silicon rectifiers, valves, thin film transistors, capacitors, inductors, variable capacitors, filters, resistors, diodes, microelectromechanical system elements (MEMS), liquid crystal chip, etc., but are not limited thereto. References of the exemplary embodiments of the disclosure are to be made in detail. Examples of the exemplary embodiments are illustrated in the drawings. If applicable, the same reference numerals in the drawings and the descriptions indicate the same or similar parts. References of the exemplary embodiments of the disclosure are to be made in detail. Examples of the exemplary embodiments are illustrated in the drawings. If applicable, the same reference numerals in the drawings and the descriptions indicate the same or similar parts. The electronic device may include an image capturing device, a bonding device, a display device, a backlight device, an antenna device, a splicing device, a touch display, a curved display, and a free shape display, but not limited thereto. The electronic device may include, for example, liquid crystal, light emitting diode, fluorescence, phosphor, other suitable display media, or a combination of the above, but is not limited thereto. The display device may be a non-self-luminous display device or a self-luminous display device. The antenna device may be a liquid crystal antenna device or a non-liquid crystal antenna device, and the sensing device may be a sensing device for sensing capacitance, light, heat or ultrasonic waves, but not limited thereto. The splicing device may be, for example, a display splicing device or an antenna splicing device, but not limited thereto. It should be noted that, the electronic device can be any arrangement and combination of the foregoing, but not limited thereto. The electronic device may be a bendable or flexible electronic device. It should be noted that, the electronic device can be any arrangement and combination of the foregoing, but not limited thereto. In addition, the shape of the electronic device may be rectangular, circular, polygonal, a shape with curved edges, or other suitable shapes. The electronic device may have peripheral systems such as a driving system, a control system, a light source system, a shelf system, etc. to support a display device, an antenna device, or a spliced device. It should be noted that, in the following embodiments, the features in several different embodiments can be replaced, reorganized, and mixed to complete other embodiments without departing from the spirit of the disclosure. As long as the features of the various embodiments do not violate the spirit of the disclosure or conflict with one another, they can be mixed and matched arbitrarily.

Unless otherwise defined, all terms (including technical and scientific terms) used herein have the same meaning as commonly understood by one of ordinary skill in the art to which this disclosure belongs. It is understood that these terms, such as those defined in commonly used dictionaries, should be interpreted as having meanings consistent with the relevant art and the background or context of the disclosure, and should not be interpreted in an idealized or overly formal manner, unless otherwise defined in the embodiments of the disclosure.

Figure 1B:
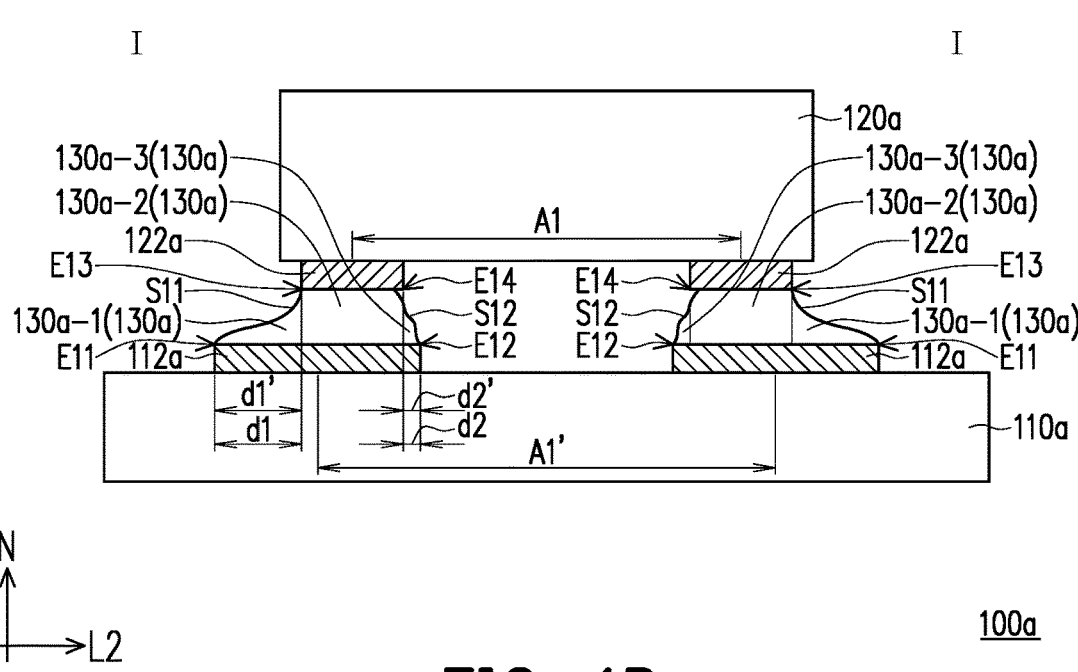
FIG. 1B is a cross-sectional schematic view along the line I-I of FIG. 1A.
Figure 1C:
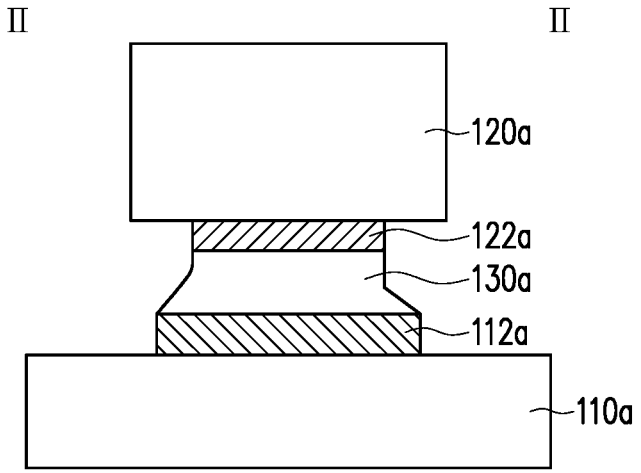
FIG. 1C is a cross-sectional schematic view along the line II-II of FIG. 1A.

FIG. 1A is a partial top schematic view of an electronic device according to one embodiment of the disclosure. FIG. 1B is a cross-sectional schematic view along the line I-I of FIG. 1A. FIG. 1C is a cross-sectional schematic view along the line II-II of FIG. 1A. For convenience of description, the connection layer is omitted in FIG. 1A.

Referring to FIG. 1A, FIG. 1B, and FIG. 1C at the same time, in this embodiment, the electronic device 100*a* includes a circuit substrate 110*a*, an electronic element 120*a*, and a connection layer 130*a*. The circuit substrate 110*a* includes a plurality of first bonding pads (two first bonding pads 112*a* are schematically shown), and a first spacing A1' is provided between two adjacent first bonding pads 112*a*. The electronic element 120*a* includes a plurality of second bonding pads 122*a* (two second bonding pads 122*a* are schematically shown), and a second spacing A1 is provided between two adjacent second bonding pads 122*a*. The second spacing A1 is different from the first spacing A1'. The connection layer 130*a* is provided between one of the plurality of first bonding pads 112*a* and one of the plurality of second bonding pads 122*a*. On a cross-section of the circuit substrate 110*a*, the connection layer 130*a* has a first side S11 and a second side S12 opposite to each other, and a length of the first side S11 is different from a length of the second side S12.

The type of the electronic element 120*a* may refer to the above description.

The connection layer 130*a* includes, for example, a solder, other conductive materials, or a combination of the foregoing, but is not limited thereto. The second bonding pads 122*a* are is electrically connected to the first bonding pads 112*a* through the connection layer 130*a*. The electronic element 120*a* of this embodiment is, for example, bonded to the circuit substrate 110*a* in a flip-chip manner, but is not limited thereto. The connection layer 130*a* includes, for example, a single layer or multiple layers of conductive material.

In this embodiment, the first spacing A1' may be defined as the distance between a center C1' of each of the two adjacent first bonding pads 112*a*. Similarly, the second spacing A1 may be defined as the distance between a center C1 of each of the two adjacent second bonding pads 122*a*. The definition of the center position is, for example, to frame a smallest rectangle for the appearance of the bonding pad, and the intersection point of the two diagonals of this rectangle is the center position (which is described in detail in FIG. 2B). In this embodiment, two adjacent first bonding pads 112a may have similar outline shapes, such as rectangle or other suitable shapes; two adjacent second bonding pads 122a may have similar outline shapes, such as rectangle or other suitable shapes. In one embodiment, the first spacing A1' is, for example, larger than the second spacing A1, but is not limited thereto. In this embodiment, one second bonding pad 122a of the electronic element 120a and one first bonding pad 112a of the circuit substrate 110a have, for example, a non-center alignment design.

Through the above non-center alignment design, a first gap distance G' (which is described in detail subsequently) between adjacent first bonding pads 112a may be appropriately adjusted. Thus, when the connection layer 130a is provided on the first bonding pads 112a, compared to the center alignment method of conventional technology, the short-circuit phenomenon between two adjacent first bonding pads 112a or between adjacent second bonding pads 122a may be reduced and/or the shifting of the electronic element 120a after reflow may be reduced, so better structural reliability is obtained.

Referring to FIG. 1A again, one of the plurality of first bonding pads 112a (the first bonding pad 112a at the top of FIG. 1A) has a first width B' along a first direction L1 and has another first width B1' along the second direction L2 perpendicular to the first direction L1. One of the plurality of second bonding pads 122a (the second bonding pad 122a at the top of FIG. 1A) has a second width B along the first direction L1 and has another second width B1 along the second direction L2. The first spacing A1' is measured substantially along the second direction L2, where the first width B' is greater than the second width B, and the another first width B1' is greater than the another second width B1. The first width B' is defined as the maximum width of the first bonding pad 112a along the first direction L1. Another first width B1' is defined as the maximum width of the first bonding pad 112a along the second direction L2. The second width B is defined as the maximum width of the second bonding pad 122a along the first direction L1. Another second width B1 is defined as the maximum width of the second bonding pad 122a along the second direction L2.

When viewed in the normal direction N of the circuit substrate 110a (or the top view direction of the electronic device), an area of one of the plurality of first bonding pads 112a (the first bonding pad 112a at the top of FIG. 1A) is, for example, larger than an area of one of the plurality of second bonding pads 122a (the second bonding pad 122a at the top of FIG. 1A). Through the above design, the first bonding pads 112a may have a larger space for setting the connection layer 130a, so that the connection layer 130a may be provided on the first bonding pads 112a more accurately, thereby reducing the risk of the short-circuit phenomenon between two adjacent first bonding pads 112a or two adjacent second bonding pads 122a and the shifting amount of the electronic element 120a after reflow. By designing the area of the first bonding pads 112a to be larger than the area of the second bonding pads 122a, a larger area may be provided for setting the connection layer 130a (such as tin), thereby reducing the shifting of subsequent components (i.e., setting of the electronic element 120a).

Furthermore, referring to FIG. 1B, on the cross-section of the electronic device 100a, the connection layer 130a has a first portion 130a-1, a second portion 130a-2, and a third portion 130a-3. The second portion 130a-2 is connected between the first portion 130a-1 and the third portion 130a-3. The second portion 130a-2 is defined as a portion of the connection layer 130a that overlaps with a projection region of the second bonding pads 122a onto the circuit substrate 110a. The first portion 130a-1 is defined as a portion away from another first bonding pad 112a of the plurality of first bonding pads that does not overlap with the projection region (e.g., the first bonding pad 112a on the right of FIG. 1B). The third portion 130a-3 is defined as a portion which is adjacent to the another first bonding pad 112a of the plurality of first bonding pads and does not overlap with the projection region (e.g., the first bonding pad 112a on the right of FIG. 1B). A maximum width d1' of the first portion 130a-1 is different from a maximum width d2' of the third portion 130a-3 in a direction perpendicular to the normal direction N of the circuit substrate 110a (e.g., the second direction L2). It should be noted that the projection described herein is an orthographic projection. In some embodiments, the maximum width d1' of the first portion 130a-1 is greater than the maximum width d2' of the third portion 130a-3, and the maximum width d2' of the third portion 130a-3 is greater than or equal to 0. In some embodiments, on the cross-section of the circuit substrate 110a, the connection layer 130a has a first side S11 and a second side S12 opposite to each other, and one of the first bonding pads 112a has a first end E11 corresponding to the first side S11 of the connection layer 130a and a second end E12 corresponding to the second side S12 of the connection layer 130a. One of the second bonding pads 122a has a third end E13 corresponding to the first side S11 and a fourth end E14 corresponding to the second side S12. In a direction perpendicular to the normal direction N of the circuit substrate 110a (e.g., the second direction L2), a first distance d1 between the first end E11 and the third end E13 is different from a second distance d2 between the second end E12 and the fourth end E14. In some embodiments, the first distance d1 is greater than the second distance d2, and the second distance d2 is greater than or equal to 0. The first distance d1 may be defined as a width protruding from the upper surface of the outer side portion of the first bonding pad 112a that does not overlap with the projection region of the second bonding pad 122a onto the circuit substrate 110a, on the cross-section of the electronic device 100a (as in FIG. 1B). The second distance d2 is defined as a width protruding from the upper surface of the inner side portion of the first bonding pad 112a that does not overlap with the projection region of the second bonding pad 122a onto the circuit substrate 110a. The inner side portion of the first bonding pad 112a may be defined as a side adjacent to another first bonding pad 112a (e.g., the first bonding pad 112a on the right side of FIG. 1B). In some embodiments, the maximum width d2' and/or the second distance d2 of the third portion 130a-3 may be designed to be close to 0 to retain a relatively large first gap distance G' (which is described in detail subsequently) between two adjacent first bonding pads 112a to reduce the risk of short-circuit, and also facilitate subsequent filling of underfill (not shown), but is not limited thereto. In some embodiments, the maximum width d1' of the first portion 130a-1 may be identical to or different from the first distance d1, and the maximum width d2' of the third portion 130a-3 may be identical to or different from the second distance d2.

In some embodiments, one of the plurality of first bonding pads 112a has a first width B' along a first direction L1, and one of the plurality of second bonding pads 122a has a second width B along the first direction L1. The first spacing A1' is measured along the second direction L2 perpendicular to the first direction L1, and the first width B', the second width B, the first distance d1, the second distance d2, and an allowable value S satisfy the following relation: B+S≤B'≤B+

5*S, and d2<S≤d1, but not limited thereto. In some embodiments, the first width B', the second width B, the first distance d1, the second distance d2, and an allowable value S satisfy the following relation: B+S≤B'≤B+4*S, and d2<S≤d1, but not limited thereto. In some embodiments, the first width B', the second width B, the first distance d1, the second distance d2, and an allowable value S satisfy the following relation: B+S≤B'≤B+3*S, and d2<S≤d1, but not limited thereto. In some embodiments, the first width B', the second width B, the first distance d1, the second distance d2, and an allowable value S satisfy the following relation: B+S≤B' ≤B+2*S, and d2<S≤d1, but not limited thereto.

In one embodiment, a first gap distance G' is provided between two adjacent first bonding pads 112a and a second gap distance G is provided between two adjacent second bonding pads 122a, where the first gap distance G', the second gap distance G, the first distance d1, the second distance d2, and the allowable value S satisfy the following relation: G'≤G≤G'+3*S, and d2<S≤d1, but not limited thereto. In one embodiment, the first gap distance G', the second gap distance G, the first distance d1, the second distance d2, and the allowable value S satisfy the following relation: G'≤G≤G'+2*S, and d2<S≤d1, but not limited thereto. In one embodiment, the first gap distance G', the second gap distance G, the first distance d1, the second distance d2, and the allowable value S satisfy the following relation: G'≤G≤G'+S, and d2<S≤d1. The above gap distance is defined as the shortest distance between two adjacent bonding pads. In other words, the first gap distance G' is the shortest distance between two adjacent first bonding pads 112a, and the second gap distance G is the shortest distance between two adjacent second bonding pads 122a. As shown in FIG. 1A, the first spacing A1' is larger than the first gap distance G', the second spacing A1 is larger than the second gap distance G, and the first gap distance G' is less than the second gap distance G. In other embodiments (not shown), the first gap distance G' may be identical to the second gap distance G.

In one embodiment, the length L of the electronic element 120a (e.g., the maximum length) may be greater than or equal to the first spacing A1'. In one embodiment, a ratio between the length L of the electronic element 120a and the first spacing A1' may be greater than 1 and less than or equal to 2., that is, L/A1'≤2, but is not limited thereto. In one embodiment, a ratio between the length L of the electronic element 120a and the first spacing A1' may be greater than 1 and less than or equal to 1.8., that is, L/A1'≤1.8. In one embodiment, a ratio between the length L of the electronic element 120a and the first spacing A1' may be greater than 1 and less than or equal to 1.5., that is, L/A1'≤1.5. In one embodiment, a ratio between the first width B' of the first bonding pad 112a and the second width B of the second bonding pad 122a is greater than 1 and less than or equal to 5, that is, 1<B'/B≤5, but is not limited thereto. In one embodiment, a ratio between the first width B' of the first bonding pad 112a and the second width B of the second bonding pad 122a is greater than 1 and less than or equal to 4, that is, 1<B'/B≤4. In one embodiment, a ratio between the first width B' of the first bonding pad 112a and the second width B of the second bonding pad 122a is greater than 1 and less than or equal to 3, that is, 1<B'/B≤3. In one embodiment, a ratio between the first width B' of the first bonding pad 112a and the second width B of the second bonding pad 122a is greater than 1 and less than or equal to 2, that is, 1<B'/B≤2. In one embodiment, a ratio between the another first width B1' of the first bonding pad 112a and the another second width B1 of the second bonding pad 122a is greater than 1 and less than or equal to 5, that is, 1<B1'/B1≤5. In one embodiment, a ratio between the another first width B1' of the first bonding pad 112a and the another second width B1 of the second bonding pad 122a is greater than 1 and less than or equal to 4, that is, 1<B1'/B1≤4. In one embodiment, a ratio between the another first width B1' of the first bonding pad 112a and the another second width B1 of the second bonding pad 122a is greater than 1 and less than or equal to 3, that is, 1<B1'/B1≤3. In one embodiment, a ratio between the another first width B1' of the first bonding pad 112a and the another second width B1 of the second bonding pad 122a is greater than 1 and less than or equal to 2, that is, 1<B1'/B1≤2.

In one embodiment, a ratio between the first spacing A1' and the second spacing A1 is greater than 1 and less than or equal to 5, that is, 1<A1'/A1≤5. In one embodiment, a ratio between the first spacing A1' and the second spacing A1 is greater than 1 and less than or equal to 4, that is, 1<A1'/A1≤4. In one embodiment, a ratio between the first spacing A1' and the second spacing A1 is greater than 1 and less than or equal to 3, that is, 1<A1'/A1≤3. In one embodiment, a ratio between the first spacing A1' and the second spacing A1 is greater than 1 and less than or equal to 2, that is, 1<A1'/A1≤2.

Since the second spacing A1 of the two adjacent second bonding pads 122a of the electronic element 120a is different from the first spacing A1' of the two adjacent first bonding pads 112a of the circuit substrate 110a, problems of conventional technology (such as short-circuit or element shifting) may be improved, so that the electronic device 100a of this embodiment may have better structural reliability. Since the area of the first bonding pad 112a is larger than the area of the second bonding pad 122a, and since the second spacing A1 is different from the first spacing A1', when the electronic element 120a is bonded to the circuit substrate 110a through the connection layer 130a, the lengths of the two sides (i.e., the first side S11 and the second side S12) of the connection layer 130a is, for example, different. In some embodiments, when viewed from different directions, referring to FIG. 1B (a cross-sectional schematic view along the line I-I of FIG. 1A) and FIG. 1C (a cross-sectional schematic view along the line II-II of FIG. 1A) at the same time, the two opposite sides of the connection layer 130a have an asymmetric design, for example, the two sides have different lengths or outlines, but is not limited thereto.

Other embodiments are described below for illustrative purposes. It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiment, and details are not described in the following embodiment.

Figure 2A:
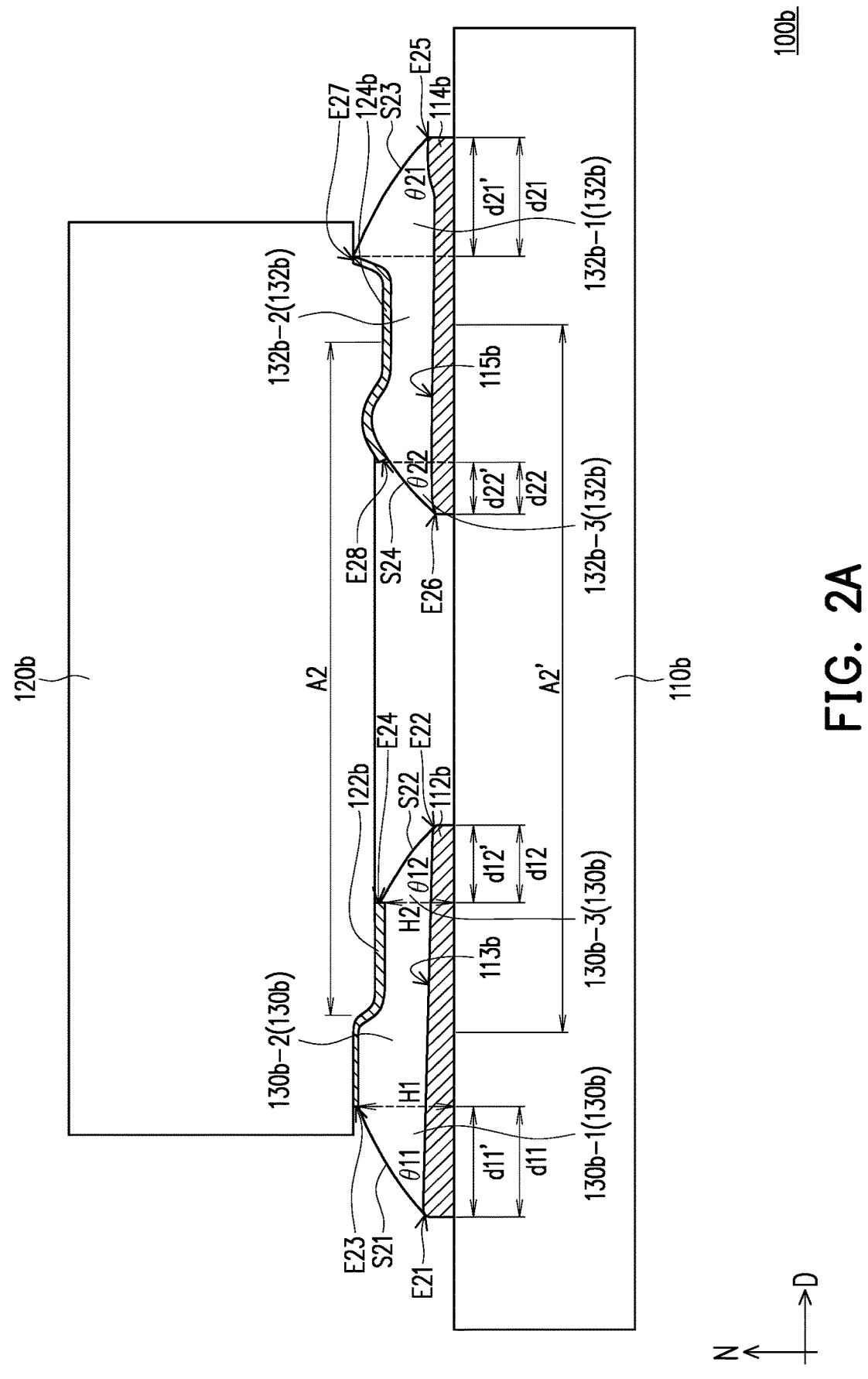
FIG. 2A is a partial cross-sectional schematic view of an electronic device according to one embodiment of the disclosure.
Figure 2B:
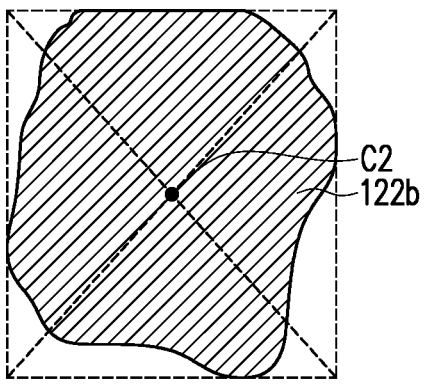
FIG. 2B is a top schematic view of the second bonding pad of FIG. 2A.

FIG. 2A is a cross-sectional schematic view of an electronic device according to one embodiment of the disclosure. FIG. 2B is a partial top schematic view of the second bonding pad of FIG. 2A. Referring to FIG. 2A and FIG. 2B at the same time, in this embodiment, the electronic element 120b in the electronic device 100b is, for example, a mini LED, but it is not limited thereto, other suitable electronic elements such as those mentioned above may also be used. In some embodiments, in a direction looking down on the electronic device 100b (i.e., in the normal direction N of the circuit substrate 110b), the appearance outline of the second bonding pad 122b and/or the second bonding pad 124b of the electronic element 120b is, for example, irregularly shaped. Thus, for example, a smallest rectangle is framed for the appearance of the second bonding pad 122b, with the intersection point of the two diagonals of this rectangle being the center position C2. In some embodiments, in a direction looking down on the electronic device 100b (i.e., in the normal direction N of the circuit substrate 110b), the appearance outlines of the first bonding pads 112b and 114b of the circuit substrate 110b may also be, for example, irregular. The center positions of the first bonding pad 112b and the first bonding pad 114b may be obtained using the above method. In some embodiments, in a direction looking down on the electronic device 100b (i.e., in the normal direction N of the circuit substrate 110b), the appearance outlines of the second bonding pads of the electronic element or the first bonding pads of the circuit substrate may have circle, rectangle, polygon, arc, or irregular shape.

In some embodiments, a first spacing A2' is provided between adjacent first bonding pad 112b and first bonding pad 114b, a second spacing A2 is provided between adjacent second bonding pad 122b and second bonding pad 124b, and the second spacing A2 is different from the first spacing A2', for example, the first spacing A2' is larger than the second spacing A2.

In some embodiments, on the cross-section of the electronic device (as shown in FIG. 2A), the connection layer 130b is provided between one of the plurality of first bonding pads (e.g., the first bonding pad 112b) and one of the plurality of second bonding pads (e.g., the second bonding pad 122b), and the connection layer 130b has a first portion 130b-1, a second portion 130b-2, and a third portion 130b-3. The second portion 130b-2 is connected between the first portion 130b-1 and the third portion 130b-3. The second portion 130b-2 is defined as a portion of the connection layer 130b that overlaps with a projection region of the second bonding pad 122b onto the circuit substrate 110b. The first portion 130b-1 is defined as a portion away from another first bonding pad of the plurality of first bonding pads that does not overlap with the projection region (e.g., the first bonding pad 132b). The third portion 130b-3 is defined as a portion which is adjacent to the another first bonding pad of the plurality of first bonding pads and does not overlap with the projection region (e.g., the first bonding pad 132b). A maximum width d11' of the first portion 130b-1 is different from a maximum width d12' of the third portion 130b-3 in a direction D perpendicular to the normal direction N of the circuit substrate 110b. In some embodiments, the maximum width d11' of the first portion 130b-1 is greater than the maximum width d12' of the third portion 130b-3, and the maximum width d12' of the third portion 130b-3 is greater than or equal to 0. On the cross-section of the electronic device (as shown in FIG. 2A), the first bonding pad 112b has a first end E21 corresponding to the first side S21 of the connection layer 130b and a second end E22 corresponding to the second side S22 of the connection layer 130b. The second bonding pad 122b has a third end E23 corresponding to the first side S21 and a fourth end E24 corresponding to the second side S22. In the direction D perpendicular to the normal direction N of the circuit substrate 110b, a first distance d11 between the first end E21 and the third end E23 is different from a second distance d12 between the second end E22 and the fourth end E24. In some embodiments, the first distance d11 is greater than the second distance d12, and the second distance d12 is greater than or equal to 0.

Similarly, on the cross-section of the electronic device (as shown in FIG. 2A), the connection layer 132b is provided between one of the plurality of first bonding pads (e.g., the first bonding pad 114b) and one of the plurality of second bonding pads (e.g., the second bonding pad 124b), and the connection layer 132b has a first portion 132b-1, a second portion 132b-2, and a third portion 132b-3. The second portion 132b-2 is connected between the first portion 132b-1 and the third portion 132b-3. The second portion 132b-2 is defined as a portion of the connection layer 132b that overlaps with a projection region of the second bonding pad 124b onto the circuit substrate 110b. The first portion 132b-1 is defined as a portion away from another first bonding pad of the plurality of first bonding pads that does not overlap with the projection region (e.g., the first bonding pad 112b). The third portion 132b-3 is defined as a portion which is adjacent to the another first bonding pad of the plurality of first bonding pads and does not overlap with the projection region (e.g., the first bonding pad 112b). A maximum width d21' of the first portion 132b-1 is different from a maximum width d22' of the third portion 132b-3 in the direction D perpendicular to the normal direction N of the circuit substrate 110b. In some embodiments, the maximum width d21' of the first portion 132b-1 is greater than the maximum width d22' of the third portion 132b-3, and the maximum width d22' of the third portion 132b-3 is greater than or equal to 0.

Similarly, on the cross-section of the electronic device, the first bonding pad 114b has a first end E25 corresponding to the first side S23 of the connection layer 132b and a second end E26 corresponding to the second side S24 of the connection layer 132b. The second bonding pad 124b has a third end E27 corresponding to the first side S23 and a fourth end E28 corresponding to the second side S24. In the direction D perpendicular to the normal direction N of the circuit substrate 110b, a first distance d21 between the first end E25 and the third end E27 is different from a second distance d22 between the second end E26 and the fourth end E28. In some embodiments, the first distance d21 is greater than the second distance d22, and the second distance d22 is greater than or equal to 0. The definitions of the first distance d11 and the first distance d21 may be referred to as illustrated in the first distance d1 of FIG. 1A above. The definitions of the second distance d12 and the second distance d22 may be referred to as illustrated in the second distance d2 of FIG. 1A above.

In some embodiments, the second distance d12 or second distance d22 may be designed to be close to 0 to retain a relatively large gap distance to reduce the risk of short-circuit, and facilitate subsequent filling of underfill (not shown), but is not limited thereto.

In some embodiments, one of the plurality of first bonding pads 112b, 114b (e.g., the first bonding pad 112b) has a first upper surface 113b. On the cross-section, a first included angle θ11 is provided between an extension line (not shown) of the first side S2 and the first upper surface 113b, a second included angle θ12 is provided between an extension line (not shown) of the second side S22 and the first upper surface 113b, and the first included angle θ11 is different from the second included angle θ12. In some embodiments, for example, θ11 is smaller than θ12. In some embodiments, for example, θ11 is greater than θ12. In some embodiments, θ11 may be, for example, between 30 degrees and 34 degrees, and θ12 may be, for example, 34 degrees to 38 degrees, but are not limited thereto.

Similarly, one of the first bonding pads 112b and 114b (e.g., the first bonding pad 114b) has a first upper surface 115b. On the cross-section, a first included angle θ21 is provided between an extension line (not shown) of the first side S23 and the first upper surface 115b, a second included angle θ22 is provided between an extension line (not shown)

of the second side S24 and the first upper surface 115*b*, and the first included angle θ21 is different from the second included angle θ22. In some embodiments, for example, θ21 is smaller than θ22. In some embodiments, for example, θ21 is greater than θ22. In some embodiments, θ21 may be, for example, between 30 degrees and 34 degrees, and θ22 may be, for example, 34 degrees to 38 degrees, but are not limited thereto.

In one embodiment, when viewed from the cross-section, along the normal direction N of the circuit substrate 110*c*, the shortest distance between the two ends of the second bonding pad 122*b* of the electronic element 120*b* (e.g., the third end E23 and the fourth end E24) and the circuit substrate 110*b* may be different, this means that the two ends of the second bonding pad 122*b* of the electronic element 120*b* (e.g., the third end E23 and the fourth end E24) have different height differences H1 and H2 with the circuit substrate 110*b*, respectively. In one embodiment, when viewed from the cross-section, the second bonding pad 122*b* and/or 124*b* has a non-flat surface. In one embodiment, a portion of the first bonding pad 112*b* and/or the first bonding pad 114*b* of the circuit substrate 110*b* may protrude from the electronic element 120*b*. In other words, in the normal direction N of the circuit substrate 110*c*, the first bonding pad 112*b* and the first bonding pad 114*b* may not overlap with the electronic element 120*b* partially. In one embodiment, the connection layer 130*b* and/or the connection layer 132*b* may protrude from the electronic element 120*b*. In other words, in the normal direction N of the circuit substrate 110*c*, the connection layer 130*b* and/or the connection layer 132*b* may not overlap with the electronic element 120*b* partially.

Figure 3:
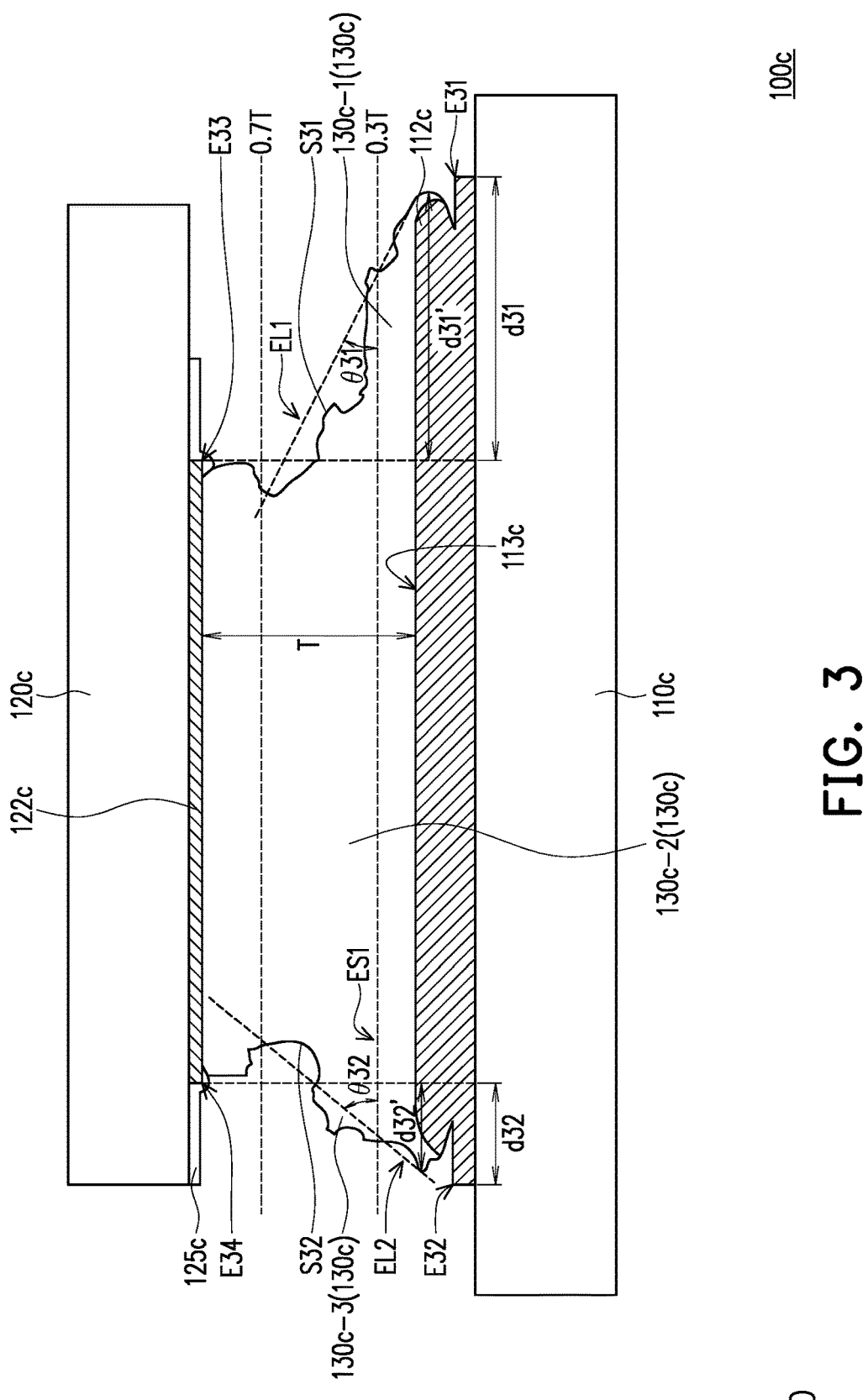
FIG. 3 is a partial cross-sectional schematic view of an electronic device according to another embodiment of the disclosure.

FIG. 3 is a partial cross-sectional schematic view of an electronic device according to another embodiment of the disclosure. Referring to FIG. 3, in this embodiment, the electronic element 120*c* in the electronic device 100*c* is, for example, a varactor diode. However, it is not limited thereto, and other suitable electronic elements as mentioned above may be used. In some embodiments, the electronic element 120*c* further includes an insulating layer 125*c*, covering a portion of the surface of the second bonding pad 122*c* adjacent to the first bonding pad 112*c*. In some embodiments, material differences between bonding pads result in different chemical interactions between elements during welding, so that the shape of the connection layer 130*c* may be different. In some embodiments, the first side S31 and the second side S32 of the connection layer 130*c* that are opposite to each other may have an irregular shape (e.g., have a concave and convex outline), and the length of the first side S31 is different from the length of the second side S32.

On the cross-section of the electronic device (as shown in FIG. 3), the connection layer 130*c* is provided between one of the plurality of first bonding pads (e.g., the first bonding pad 112*c*) and one of the plurality of second bonding pads (e.g., the second bonding pad 122*c*). The connection layer 122*c* has a first portion 130*c*-1, a second portion 130*c*-2, and a third portion 130*c*-3. The second portion 130*c*-2 is connected between the first portion 130*c*-1 and the third portion 130*c*-3. The second portion 130*c*-2 is defined as a portion of the connection layer 130*c* that overlaps with a projection region of the second bonding pad 122*c* onto the circuit substrate 110*c*. The first portion 130*c*-1 is defined as a portion away from another first bonding pad (not shown) of the plurality of first bonding pads that does not overlap with the projection region. The third portion 130*c*-3 is defined as a portion adjacent to another first bonding pad (not shown)

of the plurality of first bonding pads that does not overlap with the projection region. A maximum width d31' of the first portion 130*c*-1 is different from a maximum width d32' of the third portion 130*c*-3 in a direction D perpendicular to the normal direction N of the circuit substrate 110*c*. In some embodiments, the maximum width d31' of the first portion 130*c*-1 is greater than the maximum width d32' of the third portion 130*c*-3, and the maximum width d32' of the third portion 130*c*-3 is greater than or equal to 0.

On a cross-section of the circuit substrate 110*c*, the first bonding pad 112*c* has a first end E31 corresponding to the first side S31 of the connection layer 130*c* and a second end E32 corresponding to the second side S32 of the connection layer 130*c*. The second bonding pad 122*c* has a third end E33 corresponding to the first side S31 and a fourth end E34 corresponding to the second side S32. In the direction D perpendicular to the normal direction N of the circuit substrate 110*c*, a first distance d31 between the first end 31 and the third end E33 is different from a second distance d32 between the second end E32 and the fourth end E34. Here, the first distance d31 is greater than the second distance d32, and the second distance d32 is greater than or equal to 0. The definition of the first distance d31 may be referred to as illustrated in the first distance d1 of FIG. 1A above. The definition of the second distance d32 may be referred to as illustrated in the second distance d2 of FIG. 1A above.

In some embodiments, since the first side S31 and the second side S32 are irregularly shaped (e.g., have concave and convex outlines), the first included angle θ31 and the second included angle θ32 may be obtained, for example, in the following manner. In the normal direction N perpendicular to the circuit substrate 110*c*, first find the thickness T of the connection layer 130*c*, and then extract the points corresponding to 0.3 T and 0.7 T on the first side S31 and the second side S32, respectively; subsequently, the connecting line corresponding to the points at 0.3 T and 0.7 T on the first side S31 is drawn to obtain the extension line EL1 of the first side S31, and the connecting line corresponding to the points at 0.3 T and 0.7 T on the second side S32 is drawn to obtain the extension line EL2 of the second side S32. The first included angle θ31 may be defined as the included angle between the extension line EL1 of the first side S31 and the extension surface ES1 parallel to the first upper surface 113*c*. Similarly, the second included angle θ32 may be defined as the included angle between the extension line EL2 of the second side S32 and the extension surface ES1 parallel to the first upper surface 113*c*. In some embodiments, the first included angle θ31 is different from the second included angle θ32.

Figure 4A:
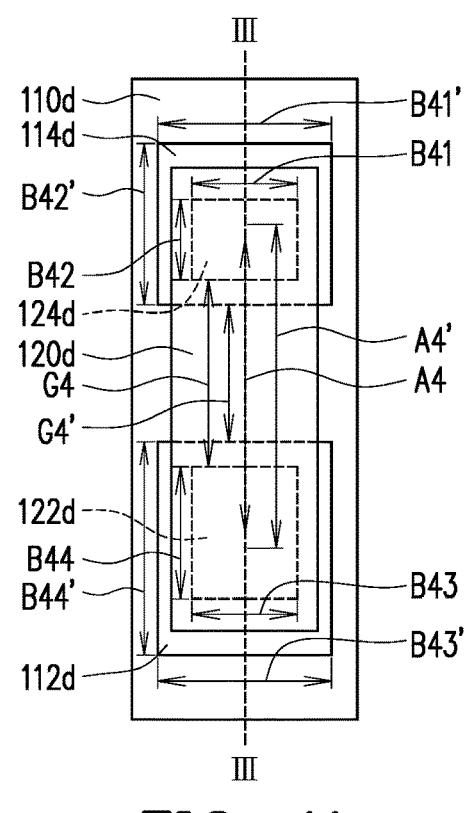
FIG. 4A is a partial top schematic view of an electronic device according to another embodiment of the disclosure.
Figure 4B:
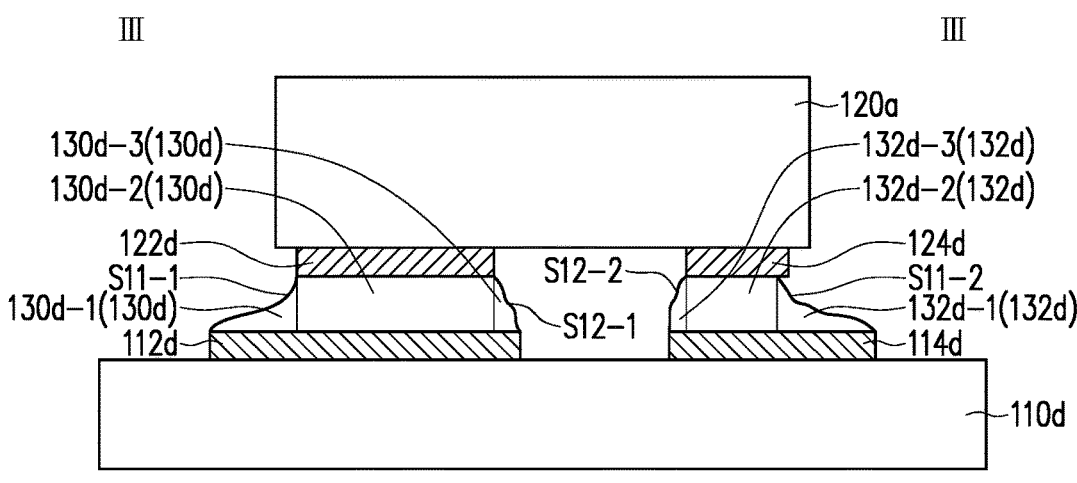
FIG. 4B is a cross-sectional schematic view along the line III-III of FIG. 4A.

FIG. 4A is a partial top schematic view of an electronic device according to another embodiment of the disclosure. FIG. 4B is a cross-sectional schematic view along the line III-III of FIG. 4A. Referring to FIG. 4A and FIG. 4B at the same time, in this embodiment, the two first bonding pads 112*d* and 114*d* of the circuit substrate 110*d* in the electronic device 100*d* have different sizes (or outlines), and the two second bonding pads 122*d* and 124*d* of the electronic element 120*d* have different sizes (or outlines). Here, the size of the first bonding pad 112*d* is, for example, larger than the size of the first bonding pad 114*d*, and the size of the second bonding pad 122*d* is, for example, larger than the size of the second bonding pad 124*d*, but is not limited thereto.

In some embodiments, a first spacing A4' is provided between adjacent first bonding pads 112*d* and 114*d*, a second spacing A4 is provided between adjacent second bonding pads 122*d* and 124*d*, and the second spacing A4 is different from the first spacing A4', for example, the first spacing A4' is larger than the second spacing A4. The definitions of the first spacing A4' and the second spacing A4 may refer to the above-mentioned first spacing A1' and second spacing A1, and will not be repeated. Furthermore, the first bonding pad 114d has a first width B41' along the first direction L1 and has another first width B42' along the second direction L2 perpendicular to the first direction L1. The second bonding pad 124d has a second width B41 along the first direction L1 and has another second width B42 along the second direction L2. In some embodiments, the first width B41' is greater than the second width B41, and the another first width B42' is greater than the another second width B42. The first bonding pad 112d has a first width B43' along the first direction L1 and has another first width B44' along the second direction L2 perpendicular to the first direction L1. The second bonding pad 122d has a second width B43 along the first direction L1 and has another second width B44 along the second direction L2. In some embodiments, the first width B43' is greater than the second width B43, and the another first width B44' is greater than the another second width B44. In some embodiments, when viewed from above, the areas of the first bonding pad 112d and the first bonding pad 114d are respectively larger than the areas of the second bonding pad 122d and the second bonding pad 124d. By designing the areas of the first bonding pad 112d and the first bonding pad 114d to be respectively larger than the areas of the second bonding pad 122d and the second bonding pad 124d, a larger area may be provided for setting the connection layer 130d (such as tin, but not limited to) and/or the connection layer 132d (such as tin, but not limited to), thereby reducing the shifting of subsequent components (i.e., setting the electronic element 120d). The definitions of the first width B41', the second width B41, the another first width B42', and the another second width B42 may refer to the above-mentioned first width B', second width B, another first width B1', and the another second width B1, and will not be repeated. The definitions of the first width B43', the second width B43, the another first width B44', and the another second width B44 may refer to the above-mentioned first width B', second width B, another first width B1', and the another second width B1, and will not be repeated.

In the embodiments of FIG. 4A and FIG. 4B, on the cross-section of a circuit substrate 110d, the connection layer 130a has a first side S11-1 and a second side S12-1 opposite to each other, and a length of the first side S11-1 is different from a length of the second side S12-1. On the cross-section of a circuit substrate 110d, the connection layer 132d has a first side S11-2 and a second side S12-2 opposite to each other, and a length of the first side S11-2 is different from a length of the second side S12-2. In some embodiments, the length of the first side S11-1 is different from the length of the first side S11-2, and the length of the second side S12-1 is different from the length of the second side S12-2.

On the cross-section of the electronic device (as shown in FIG. 4B), the connection layer 130d is provided between one of the plurality of first bonding pads (e.g., the first bonding pad 112d) and one of the plurality of second bonding pads (e.g., the second bonding pad 122d). The connection layer 122d has a first portion 130d-1, a second portion 130d-2, and a third portion 130d-3. The second portion 130d-2 is connected between the first portion 130d-1 and the third portion 130d-3. The second portion 130d-2 is defined as a portion of the connection layer 130d that overlaps with a projection region of the second bonding pad 122d onto the circuit substrate 110d. The first portion 130d-1 is defined as a portion away from another first bonding pad 114d of the plurality of first bonding pads that does not overlap with the projection region. The third portion 130d-3 is defined as a portion adjacent to another first bonding pad 114d of the plurality of first bonding pads that does not overlap with the projection region. A maximum width (not shown) of the first portion 130d-1 is different from a maximum width (not shown) of the third portion 130d-3 in a direction D perpendicular to the normal direction N of the circuit substrate 110d. In some embodiments, the maximum width (not shown) of the first portion 130c-1 is greater than the maximum width (not shown) of the third portion 130c-3, and the maximum width (not shown) of the third portion 130c-3 is greater than or equal to 0.

On the cross-section of the electronic device (as shown in FIG. 4B), the connection layer 130d is provided between one of the plurality of first bonding pads (e.g., the first bonding pad 114d) and one of the plurality of second bonding pads (e.g., the second bonding pad 124d). The connection layer 132d has a first portion 132d-1, a second portion 132d-2, and a third portion 132d-3. The second portion 132d-2 is connected between the first portion 132d-1 and the third portion 132d-3. The second portion 132d-2 is defined as a portion of the connection layer 132d that overlaps with a projection region of the second bonding pad 124d onto the circuit substrate 110d. The first portion 132d-1 is defined as a portion away from another first bonding pad 112d of the plurality of first bonding pads that does not overlap with the projection region. The third portion 132d-3 is defined as a portion adjacent to another first bonding pad 112d of the plurality of first bonding pads that does not overlap with the projection region. A maximum width (not shown) of the first portion 132d-1 is different from a maximum width (not shown) of the third portion 132d-3 in the direction D perpendicular to the normal direction N of the circuit substrate 110d. In some embodiments, the maximum width (not shown) of the first portion 132c-1 is greater than the maximum width (not shown) of the third portion 132c-3, and the maximum width (not shown) of the third portion 132c-3 is greater than or equal to 0.

In one embodiment, a first gap distance G4' is provided between two adjacent first bonding pads (e.g., the first bonding pad 112d and the first bonding pad 114d) and a second gap distance G4 is provided between two adjacent second bonding pads (e.g., the second bonding pad 122d and the second bonding pad 124d), where the first gap distance G4', the second gap distance G4, the first distance d1 (not shown in FIG. 4B, and may be referred to the definition of the first distance d1 of FIG. 1B), the second distance d2 (not shown in FIG. 4B, and may be referred to the definition of the second distance d2 of FIG. 1B), and the allowable value S satisfy the following relation: G4'≤G4≤G4'+3*S, and d2≤S≤d1, but not limited thereto. In one embodiment, the first gap distance G4', the second gap distance G4, the first distance d1, the second distance d2, and the allowable value S satisfy the following relation: G4'≤G4≤G4'+2*S, and d2≤S≤d1. In one embodiment, the first gap distance G4', the second gap distance G4, the first distance d1, the second distance d2, and the allowable value S satisfy the following relation: G4'≤G4≤G4'+S, and d2≤S≤d1. The definition of the first gap distance G4' may refer to the above-mentioned first gap distance G1', and the definition of the second gap distance G4 may refer to the above-mentioned second gap distance G1. As shown in FIG. 4A, the first spacing A4' is larger than the first gap distance G4', the second spacing A4 is larger than the second gap distance G4, and the first gap distance G4' is less than the second gap distance G4. In other embodiments (not shown), the first gap distance G4' may be identical to the second gap distance G4.

Figure 5:
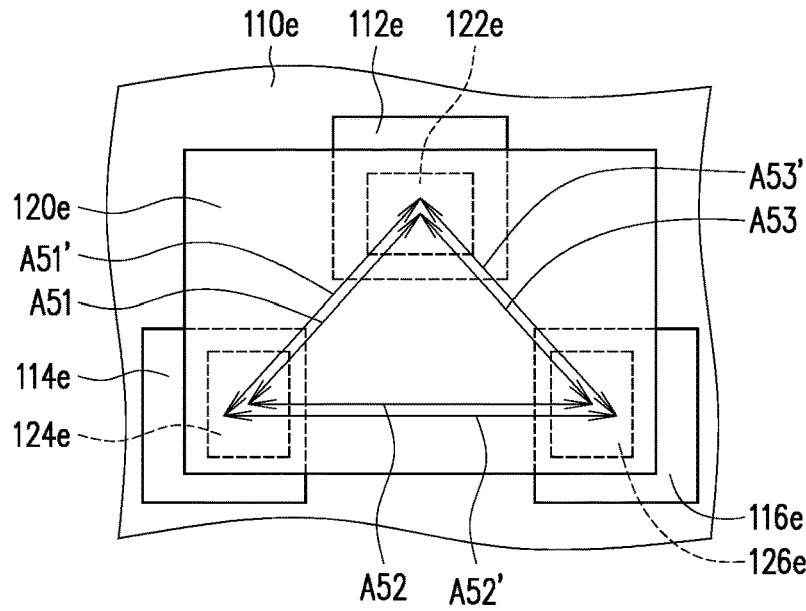
FIG. 5 is a partial top schematic view of an electronic device according to another embodiment of the disclosure.

FIG. 5 is a partial top schematic view of an electronic device according to another embodiment of the disclosure. Referring to FIG. 5, in this embodiment, the electronic element 120e in the electronic device 100e is, for example, a varactor diode. However, it is not limited thereto, and other suitable electronic elements as mentioned above may be used. In some embodiments, the circuit substrate 110e has three first bonding pads 112e, 114e, and 116e, and the electronic element 120e has three second bonding pads 122e, 124e, and 126e that are electrically connected to the first bonding pads 112e, 114e, and 116e respectively. When viewed from above, the first bonding pads 112e, 114e, and 116e may have substantially similar outline shapes or sizes (such as area), and the second bonding pads 122e, 124e, and 126e may have substantially similar outline shapes or sizes (such as area), but are not limited thereto. In some embodiments (not shown), the size or appearance of the first bonding pads 112e, 114e, and 116e may be at least partially different. In some embodiments (not shown), the size or appearance of the second bonding pads 122e, 124e, and 126e may be partially different. In some embodiments, two of the first bonding pads 112e, 114e, and 116e are, for example, ground pads, and the other one is, for example, a high-frequency signal pad, but are not limited thereto. Signals received by the first bonding pads 112e, 114e, and 116e may be adjusted according to needs.

In some embodiments, a first spacing A51' is provided between the first bonding pad 112e and the first bonding pad 114e, a first spacing A52' is provided between the first bonding pad 114e and the first bonding pad 116e, a first spacing A53' is provided between the first bonding pad 116e and the first bonding pad 112e, and the definitions of the first spacing A51', the first spacing A52', and the first spacing A53' may refer to the above-mentioned first spacing A1'. In some embodiments, the first spacing A51', the first spacing A52', and the first spacing A53' may be identical to each other or at least partially different from each other. In one embodiment, the first spacing A52' is, for example, larger than the first spacing A51' and the first spacing A53', and the first spacing A51' is, for example, similar to the first spacing A53', but is not limited thereto.

In some embodiments, a second spacing A51 is provided between the second bonding pad 122e and the second bonding pad 124e, a second spacing A52 is provided between the second bonding pad 124e and the second bonding pad 126e, a second spacing A53 is provided between the second bonding pad 126e and the second bonding pad 122e, and the second spacing A51 is different from the first spacing A51', the second spacing A52 is different from the first spacing A52', and the second spacing A53 is different from the first spacing A53'. The definitions of the second spacing A51, the second spacing A52, and the second spacing A53 may refer to the above-mentioned second spacing A1. In some embodiments, the second spacing A51, the second spacing A52, and the second spacing A53 may be identical to each other or at least partially different from each other. In one embodiment, the second spacing A52 is, for example, larger than the second spacing A51 and the second spacing A53, and the second spacing A51 is, for example, similar to the second spacing A53, but is not limited thereto.

In one embodiment, the first spacing A51' may be larger than the second spacing A51. In one embodiment, the first spacing A52' may be larger than the second spacing A52. In one embodiment, the first spacing A53' may be larger than the second spacing A53. In one embodiment, the area enclosed by the three lines of the first spacings A51', A52', and A53' may be larger than the area enclosed by the three lines of the second spacings A51, A52, and A53, where the area is, for example, a triangular area. In one embodiment, the sizes (such as length, width and area) of the first bonding pads 112e, 114e, and 116e may be respectively larger than the sizes (such as length, width and area) of the corresponding second bonding pads 122e, 124e, and 126e, but is not limited thereto. In one embodiment, the projection area enclosed by the three lines of the second spacings A51, A52, and A53 (e.g., the projection area projected onto the circuit substrate 110e) may be located, for example, within the projection area enclosed by the three lines of the first spacings A51', A52', and A53' (e.g., the projection area projected onto the circuit substrate 110e). In one embodiment, the first bonding pads 112e, 114e, and/or 116e may partially protrude from the electronic element 120e. In one embodiment, the projection area enclosed by the three lines of the second spacings A51, A52, and A53 (e.g., the projection area projected onto the circuit substrate 110e) may be located, for example, within the projection area of the electronic element 120e (e.g., the projection area projected onto the circuit substrate 110e). In one embodiment, the projection area enclosed by the three lines of the first spacings A51', A52', and A53' (e.g., the projection area projected onto the circuit substrate 110e) may be located, for example, within the projection area of the electronic element 120e (e.g., the projection area projected onto the circuit substrate 110e).

Figure 6:
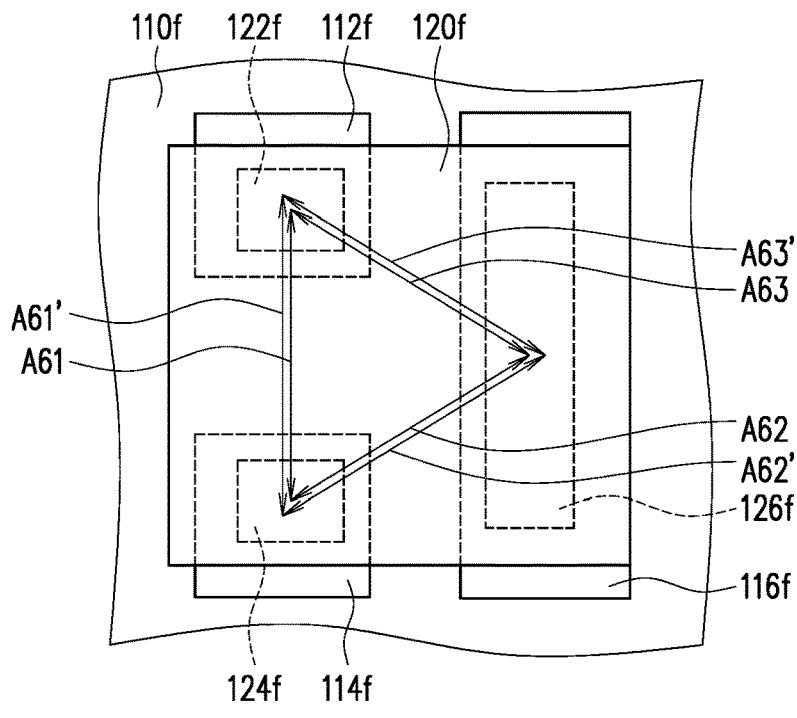
FIG. 6 is a partial top schematic view of an electronic device according to another embodiment of the disclosure.

FIG. 6 is a partial top schematic view of an electronic device according to another embodiment of the disclosure. Referring to FIG. 6, in this embodiment, the electronic device 100f is, for example, a varactor diode. However, it is not limited thereto, and other suitable electronic elements as mentioned above may be used. The circuit substrate 110f has three first bonding pads 112f, 114f, and 116f, and the electronic element 120f has three second bonding pads 122f, 124f, and 126f that are electrically connected to the first bonding pads 112f, 114f, and 116f respectively. When viewed from above, the first bonding pads 112f and 114f may have substantially similar outlines or sizes (such as area), and the outline appearance of the first bonding pad 116f is different from the first bonding pads 112f and 114f, and the size of the first bonding pad 116f is larger than the size of the first bonding pads 112f and 114f. In one embodiment, the first bonding pads 112f and 114f are ground pads, and the first bonding pad 116f is a high-frequency signal pad, but are not limited thereto. Signals received by the first bonding pads 112f, 114f, and 116f may be adjusted according to needs. When viewed from above, the second bonding pads 122f and 124f may have substantially similar outlines or sizes (such as area), and the outline appearance of the second bonding pad 126f is different from the second bonding pads 122f and 124f, and the size of the second bonding pad 126f is larger than the size of the second bonding pads 122f and 124f.

In some embodiments, a first spacing A61' is provided between the first bonding pad 112f and the first bonding pad 114f, a first spacing Af2' is provided between the first bonding pad 114f and the first bonding pad 116f, and a first spacing A63' is provided between the first bonding pad 116f and the first bonding pad 112f. The definitions of the first spacing A61', the first spacing A62', and the first spacing A63' may refer to the above-mentioned first spacing A1'. In some embodiments, the first spacing A61', the first spacing A62', and the first spacing A63' may be identical to each other or at least partially different from each other.

In some embodiments, a second spacing A61 is provided between the second bonding pad 122f and the second bonding pad 124f, a second spacing A62 is provided between the second bonding pad 124f and the second bonding pad 126f, and a second spacing A63 is provided between the second bonding pad 126f and the second bonding pad 122f. The definitions of the second spacing A61, the second spacing A62, and the second spacing A63 may refer to the above-mentioned second spacing A1. In some embodiments, the second spacing A61, the second spacing A62, and the second spacing A63 may be identical to each other or at least partially different from each other. In some embodiments, the second spacing A61 is different from the first spacing A61', the second spacing A62 is different from the first spacing A62', and the second spacing A63 is different from the first spacing A63'.

In one embodiment, the first spacing A61' may be larger than the second spacing A61, the first spacing A62' may be larger than the second spacing A62, and the first spacing A63' may be larger than the second spacing A63. In one embodiment, the area enclosed by the three lines of the first spacings A61', A62', and A63' may be larger than the area enclosed by the three lines of the second spacings A61, A62, and A63, where the area is, for example, a triangular area. In one embodiment, the sizes (such as length, width and area) of the first bonding pads 112f and 114f may be respectively larger than the sizes (such as length, width and area) of the corresponding second bonding pads 122f and 124f, and the size (such as length, width and area) of the first bonding pad 116f may be larger than the size (such as length, width and area) of the corresponding second bonding pad 126f. In one embodiment, the projection area enclosed by the three lines of the second spacings A61, A62, and A63 (e.g., the projection area projected onto the circuit substrate 110f) may be located, for example, within the projection area enclosed by the three lines of the first spacings A61', A62', and A63' (e.g., the projection area projected onto the circuit substrate 110f). In one embodiment, the first bonding pads 112f, 114f, and/or 116f may partially protrude from the electronic element 120f. In one embodiment, the projection area enclosed by the three lines of the second spacings A61, A62, and A63 (e.g., the projection area projected onto the circuit substrate 110f) may be located, for example, within the projection area of the electronic element 120f (e.g., the projection area projected onto the circuit substrate 110f). In one embodiment, the projection area enclosed by the three lines of the first spacings A61', A62', and A63' (e.g., the projection area projected onto the circuit substrate 110f) may be located, for example, within the projection area of the electronic element 120f (e.g., the projection area projected onto the circuit substrate 110f).

Figure 7:
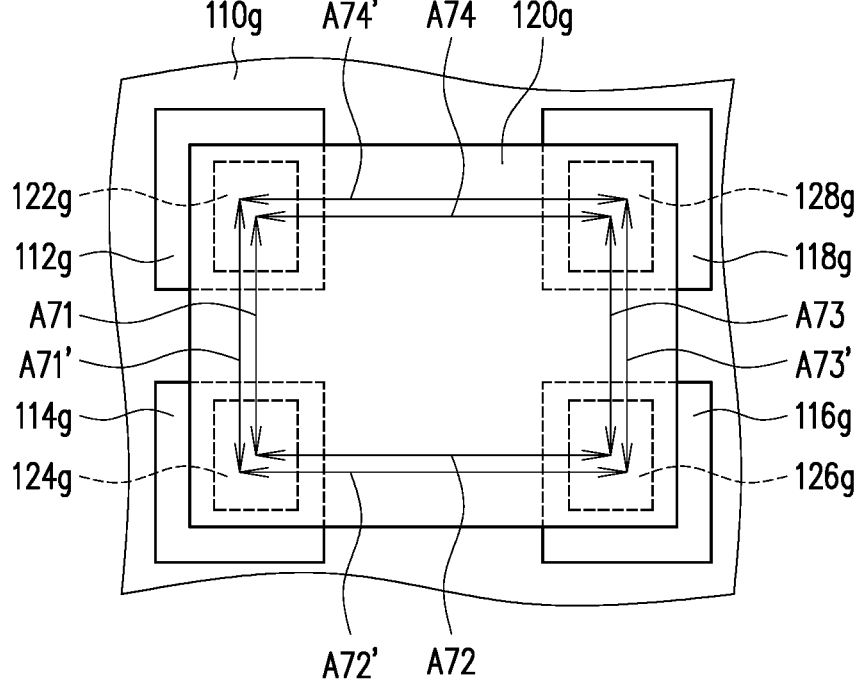
FIG. 7 is a partial top schematic view of an electronic device according to another embodiment of the disclosure.

FIG. 7 is a partial top schematic view of an electronic device according to another embodiment of the disclosure. In this embodiment, the electronic device 100g is, for example, a varactor diode. However, it is not limited thereto, and other suitable electronic elements as mentioned above may be used. The circuit substrate 110g has four first bonding pads 112g, 114g, 116g, and 118g, while the electronic element 120g has four second bonding pads 122g, 124g, 126g, and 128g. When viewed from above, the first bonding pads 112g, 114g, 116g, and 118g have substantially similar outline shapes or sizes (such as length, width and area), and the second bonding pads 122g, 124g, 126g, and 128g have substantially similar outline shapes or sizes (such as length, width and area). Two of the first bonding pads 112g, 114g, 116g, and 118g are ground pads, while the other two are high-frequency signal pads, but are not limited thereto.

In this embodiment, a first spacing A71' is provided between the first bonding pad 112g and the first bonding pad 114g, and a first spacing A72' is provided between the first bonding pad 114g and the first bonding pad 116g. A first spacing A73' is provided between the first bonding pad 116g and the first bonding pad 118g, and a first spacing A74' is provided between the first bonding pad 118g and the first bonding pad 112g. The definitions of the first spacing A71', the first spacing A72', the first spacing A73', and the first spacing A74' may refer to the above-mentioned first spacing A1'. In some embodiments, the first spacing A71', the first spacing A72', the first spacing A73', and the first spacing A74' may be identical to each other or at least partially different from each other.

In some embodiments, a second spacing A71 is provided between the second bonding pad 122g and the second bonding pad 124g, and a second spacing A72 is provided between the second bonding pad 124g and the second bonding pad 126g. A second spacing A73 is provided between the second bonding pad 126g and the second bonding pad 128g, and a second spacing A74 is provided between the second bonding pad 128g and the second bonding pad 122g. The definitions of the second spacing A71, the second spacing A72, the second spacing A73, and the second spacing A74 may refer to the above-mentioned second spacing A1. The second spacing A71 is different from the first spacing A71', the second spacing A72 is different from the first spacing A72', the second spacing A73 is different from the first spacing A73', and the second spacing A74 is different from the first spacing A74'.

In one embodiment, the first spacing A71' may be larger than the second spacing A71, and the first spacing A72' may be larger than the second spacing A72. The first spacing A73' may be larger than the second spacing A73, and the first spacing A74' may be larger than the second spacing A74. In one embodiment, the area enclosed by the four lines of the first spacings A71', A72', A73', and A74' may be larger than the area enclosed by the four lines of the second spacings A71, A72, A73, and A74, where the area is, for example, a rectangle area, but is not limited thereto. In one embodiment, the sizes (such as length, width and area) of the first bonding pads 112g, 114g, 116g, and 118g may be respectively larger than the sizes (such as length, width and area) of the corresponding second bonding pads 122g, 124g, 126g, and 128g, but is not limited thereto. In one embodiment, the projection area enclosed by the four lines of the first spacings A71', A72', A73', and A74' (e.g., the projection area projected onto the circuit substrate 110g) may be located, for example, within the projection area enclosed by the four lines of the second spacings A71, A72, A73, and A74 (e.g., the projection area projected onto the circuit substrate 110g). In one embodiment, the first bonding pads 112g, 114g, 116g, and 118g may partially protrude from the electronic element 120g.

It should be noted that FIG. 5 to FIG. 7 show partial top schematic views of the electronic device, but there may be, for example, a similar appearance of the connection layer between the first bonding pads and the second bonding pads, which are bonded to each other, as shown in FIG. 1B, FIG. 1C, FIG. 2A, FIG. 3, and FIG. 4B. For example, the connection layer has a first side and a second side opposite to each other, and a length of the first side is different from a length of the second side. Similarly, the cross-section appearance or design of the connection layer (not shown) between any of the corresponding first bonding pads and second bonding pads illustrated in FIG. 5 to FIG. 7 may be similar to that of FIG. 1A and FIG. 1B, in which the maximum width d1' of the first portion 130*a*-1 is greater than the maximum width d2' of the third portion 130*a*-3, and the maximum width d2' is greater than or equal to 0. Similarly, the relation between any of the corresponding first bonding pads and second bonding pads illustrated in FIG. 5 to FIG. 7 may be similar to that of FIG. 1A and FIG. 1B, in which the first distance d1 is greater than the second distance d2, and the second distance d2 is greater than or equal to 0.

To sum up, in the embodiment of the disclosure, the spacing between two adjacent second bonding pads of the electronic element is different from the spacing between two adjacent first bonding pads of the circuit substrate, meaning that the first bonding pads and the second bonding pads are not in a center alignment design. Moreover, the appearance of the connection layer provided between the first bonding pads and the second bonding pads is designed as described above (e.g., the length of the first side is different from the length of the second side), or "the maximum width of the first portion of the connection layer is greater than the maximum width of the third portion" may improve the problems of conventional technology, so that the electronic device of the disclosure may have better structural reliability.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and their equivalents and not by the above detailed descriptions.

What is claimed is:

1. An electronic device, comprising:
a circuit substrate, comprising a plurality of first bonding pads;
an electronic element, comprising a plurality of second bonding pads; and
a connection layer, provided between one of the plurality of first bonding pads and one of the plurality of second bonding pads,
wherein the connection layer comprises a first portion, a second portion, and a third portion, the second portion is connected between the first portion and the third portion, the second portion is defined as a portion of the connection layer that overlaps with a projection region of the second bonding pad onto the circuit substrate, the first portion is defined as a portion away from another first bonding pad of the plurality of first bonding pads that does not overlap with the projection region, and the third portion is defined as a portion which is adjacent to the another first bonding pad of the plurality of first bonding pads and does not overlap with the projection region, wherein a maximum width of the first portion is different from a maximum width of the third portion in a direction perpendicular to a normal direction of the circuit substrate;
wherein the connection layer has a first side and a second side opposite to each other, a length of the first side of the connection layer is different from a length of the second side; and
wherein the one of the plurality of first bonding pads has a first upper surface, on a cross-section, a first included angle is provided between an extension line of the first side and the first upper surface, a second included angle is provided between an extension line of the second side and the first upper surface, and the first included angle is different from the second included angle.

2. The electronic device according to claim 1, wherein the maximum width of the first portion is greater than the maximum width of the third portion, and the maximum width of the third portion is greater than or equal to 0.

3. The electronic device according to claim 1, wherein a first spacing is provided between two adjacent first bonding pads, a second spacing is provided between two adjacent second bonding pads, and the first spacing is different from the second spacing.

4. The electronic device according to claim 1, wherein the first included angle is between 30 degrees and 34 degrees, and the second included angle is between 34 degrees and 38 degrees.

5. The electronic device according to claim 1, wherein the one of the plurality of first bonding pads has a first width along a first direction and has another first width along a second direction perpendicular to the first direction, wherein the one of the plurality of second bonding pads has a second width along the first direction and has another second width along the second direction, and the first width is greater than the second width, and the another first width is greater than the another second width.

6. The electronic device according to claim 1, wherein an area of the one of the plurality of first bonding pads is larger than an area of the one of the plurality of second bonding pads.

7. The electronic device according to claim 1, wherein the one of the plurality of second bonding pads is electrically connected to the one of the plurality of first bonding pads through the connection layer.

8. The electronic device according to claim 3, wherein on a cross-section of the circuit substrate, the connection layer has a first side and a second side opposite to each other, the one of the plurality of first bonding pads has a first end corresponding to the first side and a second end corresponding to the second side, the one of the plurality of second bonding pads has a third end corresponding to the first side and a fourth end corresponding to the second side, and in the direction perpendicular to the normal direction of the circuit substrate, a first distance between the first end and the third end is different from a second distance between the second end and the fourth end.

9. The electronic device according to claim 3, wherein a length of the electronic element is greater than or equal to the first spacing.

10. The electronic device according to claim 3, wherein a ratio between the first spacing and the second spacing is greater than 1 and less than or equal to 5.

11. The electronic device according to claim 5, wherein a ratio between the first width and the second width is greater than 1 and less than or equal to 5.

12. The electronic device according to claim 5, wherein a ratio between the another first width and the another second width is greater than 1 and less than or equal to 5.

13. The electronic device according to claim 8, wherein the one of the plurality of first bonding pads has a first width along a first direction, the one of the plurality of second bonding pads has a second width along the first direction, the first spacing is measured along a second direction perpendicular to the first direction, and the first width, the second width, the first distance, and the second distance satisfy the following relation:

$$B+S \leq B' \leq B+5*S, \text{ and } d2 < S \leq d1,$$

where B' is the first width, B is the second width, d1 is the first distance, d2 is the second distance, and S is an allowable value.

14. The electronic device according to claim 8, wherein a first gap distance is provided between two adjacent first bonding pads, a second gap distance is provided between two adjacent second bonding pads, wherein the first gap distance, the second gap distance, the first distance, and the second distance satisfy the following relation:

$$G' \leq G \leq G' + 3*S, \text{ and } d2 < S \leq d1,$$

where G' is the first gap distance, G is the second gap distance, d1 is the first distance, d2 is the second distance, and S is an allowable value.

15. The electronic device according to claim 8, wherein the first distance is greater than the second distance, and the second distance is greater than or equal to 0.

16. The electronic device according to claim 8, wherein the maximum width of the first portion is identical to or different from the first distance.

17. The electronic device according to claim 8, wherein the maximum width of the third portion is identical to or different from the second distance.

18. The electronic device according to claim 9, wherein a ratio between the length of the electronic element and the first spacing is greater than 1 and less than or equal to 2.

\* \* \* \* \*